US012745499B2

(12) United States Patent
Cheng

(10) Patent No.: US 12,745,499 B2
(45) Date of Patent: Sep. 22, 2026

(54) SEMICONDUCTOR STRUCTURES AND MANUFACTURING METHODS THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 443 days.

(21) Appl. No.: 18/450,296

(22) Filed: Aug. 15, 2023

(65) Prior Publication Data

US 2024/0213296 A1 Jun. 27, 2024

(30) Foreign Application Priority Data

Dec. 21, 2022 (CN) ........................ 202211652436.X

(51) Int. Cl.
*H10H 29/14* (2025.01)
*H10H 20/01* (2025.01)
*H10H 20/821* (2025.01)
*H10H 20/851* (2025.01)

(52) U.S. Cl.
CPC .......... *H10H 29/142* (2025.01); *H10H 20/01* (2025.01); *H10H 20/821* (2025.01); *H10H 20/8512* (2025.01)

(58) Field of Classification Search
CPC .... H10H 29/142; H10H 20/01; H10H 20/821; H10H 20/8512
See application file for complete search history.

(56) References Cited

U.S. PATENT DOCUMENTS

2009/0032799 A1* 2/2009 Pan ...................... H10H 20/821 257/E33.023
2010/0109026 A1* 5/2010 Onushkin ............ H10H 29/142 257/E33.001
2017/0352601 A1* 12/2017 Hugon ................. H10H 29/142
2019/0035845 A1* 1/2019 Zhang .................. H10H 20/816
(Continued)

FOREIGN PATENT DOCUMENTS

CN 110556453 B 11/2020
CN 114300602 A 4/2022
WO WO-2021166684 A1 * 8/2021 ............ H10W 74/00

*Primary Examiner* — Jeff W Natalini
*Assistant Examiner* — Rose Keagy
(74) *Attorney, Agent, or Firm* — Carroll, Hoette & Butscher, LLC; Christopher R. Carroll

(57) ABSTRACT

A semiconductor structure and a manufacturing method thereof are provided. The method includes: providing a patterned substrate, where the patterned substrate includes columnar structures; providing second inhibition layers, where the second inhibition layers are respectively located between two adjacent columnar structures of the columnar structures, and upper surfaces of the columnar structures are exposed; providing a light-emitting structure layer on the upper surface of each of the columnar structures; and removing the patterned substrate, to obtain holes at regions corresponding to the columnar structures, where the holes are respectively located between two adjacent second inhibition layers of the second inhibition layers, and the holes correspond to the light-emitting structure layers respectively. The manufacturing method provided by the present disclosure optimizes the manufacturing process and realizes full-color LED.

10 Claims, 6 Drawing Sheets

(56) References Cited

U.S. PATENT DOCUMENTS

| | | | | |
|---|---|---|---|---|
| 2020/0027917 | A1* | 1/2020 | Kim ..................... | H10H 20/857 |
| 2021/0020806 | A1* | 1/2021 | Dimitropoulos ..... | H10H 20/819 |
| 2023/0072941 | A1* | 3/2023 | Miyairi ................ | H10H 20/851 |

* cited by examiner 122
14
A
A'

SEMICONDUCTOR STRUCTURES AND MANUFACTURING METHODS THEREOF

CROSS REFERENCE TO RELATED APPLICATIONS

This application claims priority to Chinese Patent Application No. 202211652436X filed on Dec. 21, 2022, the entire content of which is incorporated herein by reference.

TECHNICAL FIELD

The present disclosure relates to the field of semiconductor technology, in particular to semiconductor structures and manufacturing methods thereof.

BACKGROUND

Micro-led uses blue light-emitting structure to excite red and green quantum dots to realize full-color display. Compared with traditional LED (light-emitting device) display, micro-led display has higher picture brightness, higher picture contrast, richer dark field details, and more accurate color rendition.

In the related technologies, the efficiency and service life of the blue light micro-led are relatively high, but the performance of the red micro-led and green micro-led is relatively poor, and the red and green micro-leds generally need to be transferred to the substrate in batches. The process is cumbersome, resulting in a low yield of the product, and it is difficult to achieve full-color display.

SUMMARY

In view of this, the present disclosure provides semiconductor structures and manufacturing methods thereof.

In the first aspect, the present disclosure provides a manufacturing method of a semiconductor structure, including: providing a patterned substrate, where the patterned substrate includes columnar structures; providing second inhibition layers, where the second inhibition layers are respectively located between two adjacent columnar structures of the columnar structures, and upper surfaces of the columnar structures are exposed; providing a light-emitting structure layer on the upper surface of each of the columnar structures; and removing the patterned substrate, to obtain holes at regions corresponding to the columnar structures, where the holes are respectively located between two adjacent second inhibition layers of the second inhibition layers, and the holes correspond to the light-emitting structure layers respectively.

In some embodiments, the method further includes: providing color converting layers in the holes, where one of the light-emitting structure layers and one of the color converting layer corresponding to the one of the light-emitting structure layers are stacked and arranged along a light-emitting direction, and the second inhibition layers are respectively located between two adjacent color converting layers of the color converting layers.

In some embodiments, after providing the light-emitting structure layers on the upper surfaces of the columnar structures and before removing the patterned substrate, the method further includes: filling an insulation layer between two adjacent light-emitting structure layers of the light-emitting structure layers.

In some embodiments, when a material of the insulation layer is a transparent material, a ratio of a projected area of the second inhibition layers on a plane of the patterned substrate to a projected area of the light-emitting structure layers on the plane of the patterned substrate is greater than or equal to 1.

In some embodiments, after providing the light-emitting structure layers on the upper surfaces of the columnar structures, the method further includes: inverting a structure obtained after providing the light-emitting structure layers on the upper surfaces of the columnar structures on a support base.

In some embodiments, providing the second inhibition layers including: providing a first inhibition layer on a side of the patterned substrate with the columnar structures; and removing the first inhibition layer above the columnar structures, to obtain the second inhibition layers, where the second inhibition layers are respectively located between two adjacent columnar structures of the columnar structures.

In some embodiments, at least two of the columnar structures have different cross-sectional areas.

In some embodiments, one of the light-emitting structure layers includes: a first semiconductor layer, an active layer and a second semiconductor layer that are stacked, and the active layer is located on a side of the first semiconductor layer far from the patterned substrate, and a conductive type of the second semiconductor layer is opposite to a conductive type of the first semiconductor layer; and after providing the light-emitting structure layers on the upper surfaces of the columnar structures, and before removing the patterned substrate, the method further includes: providing a first electrode and a second electrode, where the first electrode penetrates the second semiconductor layer and the active layer, and is electrically connected to the first semiconductor layer; and the second electrode is electrically connected to the second semiconductor layer.

In some embodiments, the patterned substrate includes a silicon substrate; and after removing the first inhibition layer above the columnar structures, to obtain the second inhibition layers, the method further includes: treating the exposed upper surfaces of the columnar structures with an alkaline solution, such that the exposed upper surfaces of the columnar structures are (111) crystal surfaces.

In some embodiments, after removing the patterned substrate to obtain the holes at regions corresponding to the columnar structures, the method further includes: forming a second light-emitting structure layer in each of the holes.

In the second aspect, the present disclosure further provides a semiconductor structure, including: light-emitting structure layers and holes that are stacked, where the holes are located on a light-emitting side of the light-emitting structure layers; and second inhibition layers, where the second inhibition layers are respectively located between two adjacent holes of the holes.

In some embodiments, the semiconductor structure further includes: a color converting layer located in each of the holes.

In some embodiments, the semiconductor structure further includes: an insulation layer located between two adjacent light-emitting structure layers of the light-emitting structure layers.

In some embodiments, a material of the insulation layer is a transparent material or a non-transparent material.

In some embodiments, when the material of the insulation layer is transparent material, a ratio of a projected area of the second inhibition layers on a horizontal plane to a projected area of the light-emitting structure layers on the horizontal plane is greater than or equal to 1, and the horizontal plane is parallel to an arranging direction of the second inhibition layers.

In some embodiments, at least two of the light-emitting structure layers have different cross-sectional areas.

In some embodiments, the semiconductor structure further includes: a nucleation layer or a buffer layer located between one of the color converting layers and one of the light-emitting structure layers corresponding to the one of the color converting layers.

In some embodiments, the light-emitting structure layers emit blue light, and the color converting layers include at least one of: yellow quantum dots, yellow phosphors, red quantum dots, red phosphors, green quantum dots or green phosphors.

In some embodiments, the semiconductor structure further includes: a reflection layer located on a side of each of the light-emitting structure layers far from the holes.

In some embodiments, one of the light-emitting structure layers includes a first semiconductor layer, an active layer and a second semiconductor layer that are stacked, where the active layer is located on a side of the first semiconductor layer far from the substrate, and a conductive type of the second semiconductor layer is opposite to a conductive type of the first semiconductor layer; and the semiconductor structure further includes: a first electrode and a second electrode, where the first electrode penetrates the second semiconductor layer and the active layer, and is electrically connected to the first semiconductor layer, and the second electrode is electrically connected to the second semiconductor layer.

In some embodiments, the semiconductor structure further includes: a second light-emitting structure layer in each of the holes, where the second light-emitting structure layer is on a light-emitting side of the corresponding light-emitting structure layer.

DETAILED DESCRIPTION

Exemplary embodiments will be described in detail herein, examples of which are illustrated in the accompanying drawings. These embodiments are only examples of devices and methods consistent with some aspects of the present disclosure as detailed in the attached claims, and do not represent all embodiments consistent with the present disclosure.

It should be understood that although the terms first, second, etc. may be used in the present disclosure to describe various information, such information should not be limited to these terms. These terms are only used to distinguish the same type of information from each other. For example, without departing from the scope of the present disclosure, a first inhibition layer can also be called a second inhibition layer, similarly, a second inhibition layer can also be called a first inhibition layer.

The present disclosure provides a manufacturing method of a semiconductor structure, which includes steps S1-S4.

Figure 1:
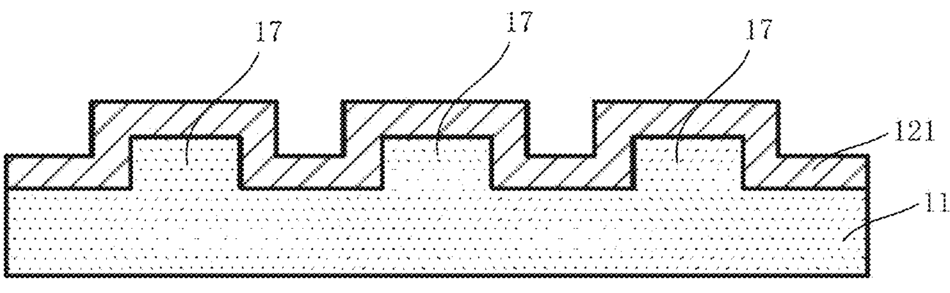
FIG. 1 is an intermediate structure diagram of a manufacturing method of a semiconductor structure according to an embodiment of the present disclosure.

FIG. 1 is an intermediate structure diagram of a manufacturing method of a semiconductor structure according to an embodiment of the present disclosure. As shown in FIG. 1, in S1, a patterned substrate 11 is provided, where the patterned substrate 11 includes a plurality of columnar structures 17.

In some embodiments, a material of the patterned substrate 11 includes at least one of sapphire, silicon carbide, silicon or GaN-based materials. In addition, a cross section of the columnar structure 17 parallel to a plane where the patterned substrate 11 is located can be circular, quadrilateral, triangular, hexagonal, etc., which is not limited in the present disclosure.

Figure 2A:
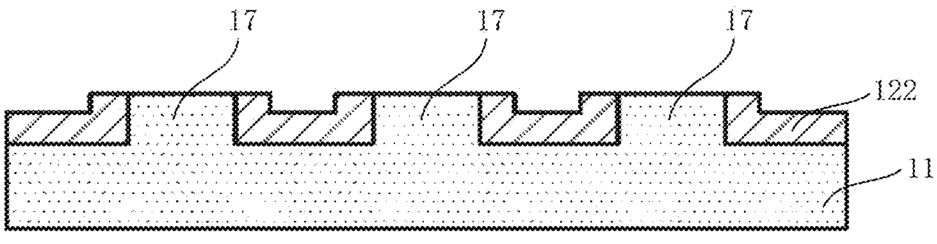
FIG. 2A is an intermediate structure diagram of a manufacturing method of a semiconductor structure according to an embodiment of the present disclosure.
Figure 2B:
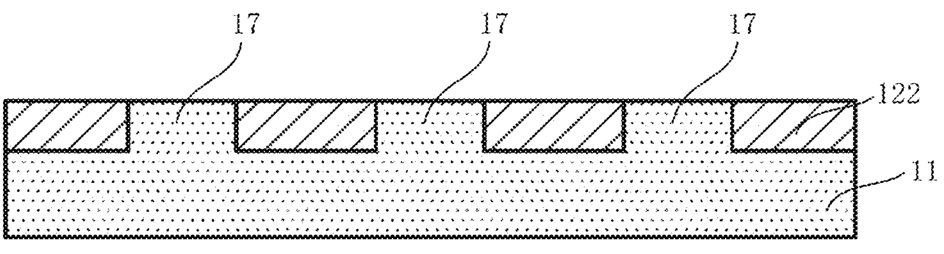
FIG. 2B is an intermediate structure diagram of a manufacturing method of a semiconductor structure according to an embodiment of the present disclosure.

FIG. 2A is an intermediate structure diagram of a manufacturing method of a semiconductor structure according to an embodiment of the present disclosure, and FIG. 2B is an intermediate structure diagram of a manufacturing method of a semiconductor structure according to an embodiment of the present disclosure. As shown in FIG. 2A and FIG. 2B, in S2, multiple second inhibition layers 122 are provided, and the upper surfaces of the columnar structures 17 are exposed.

In some embodiments, steps of providing the second inhibition layers 122 include steps S21 and S22. In S21, a first inhibition layer 121 is provided on a side of the patterned substrate 11 with the columnar structures 17. In S22, the first inhibition layer 121 on the columnar structures 17 is removed to obtain the second inhibition layers 122, which are located between the columnar structures 17.

In some embodiments, as shown in FIG. 1, the first inhibition layer 121 can cover the surface of the side of the patterned substrate 11 with the columnar structures 17, but not fill up gaps between the plurality of columnar structures 17. In other embodiments, the first inhibition layer 121 can cover the surface of a side of the patterned substrate 11 with the columnar structures 17, and fill up gaps between the plurality of columnar structures 17. In some examples, a material of the first inhibition layer 121 may include $SiO_2$, SiN, or a combination of $SiO_2$ and SiN. A formation process of the first inhibition layer 121 may be a deposition process.

In some embodiments, the chemical mechanical polishing (CMP) technology can be used to remove the first inhibition layer 121 on the columnar structures 17 to obtain the second inhibition layers 122 to expose the surfaces of the columnar structures 17. When the first inhibition layer 121 does not fill up the gaps between multiple columnar structures 17, the first inhibition layer 121 on the columnar structures 17 is removed to obtain the second inhibition layers 122 as shown in FIG. 2A. When the first inhibition layer 121 fills up the gaps between multiple columnar structures 17, the first inhibition layer 121 on the columnar structures 17 is removed to obtain the second inhibition layers 122 as shown in FIG. 2B.

Specifically, when the first inhibition layer 121 made of $SiO_2$ or SiN is deposited on a Si substrate, the $SiO_2$ or SiN particles can attach to all directions of the patterned Si substrate, and a monocrystalline GaN epitaxial material cannot be manufactured. In the embodiment provided by the present disclosure, the side wall of the columnar structure 17 is protected by the second inhibition layer 122, the exposed surface of the columnar structure is defined as the growth region, and the gaps between multiple columnar structures are the growth inhibition regions, so as to realize the selective and controllable growth of the GaN-LED structure.

Figure 3A:
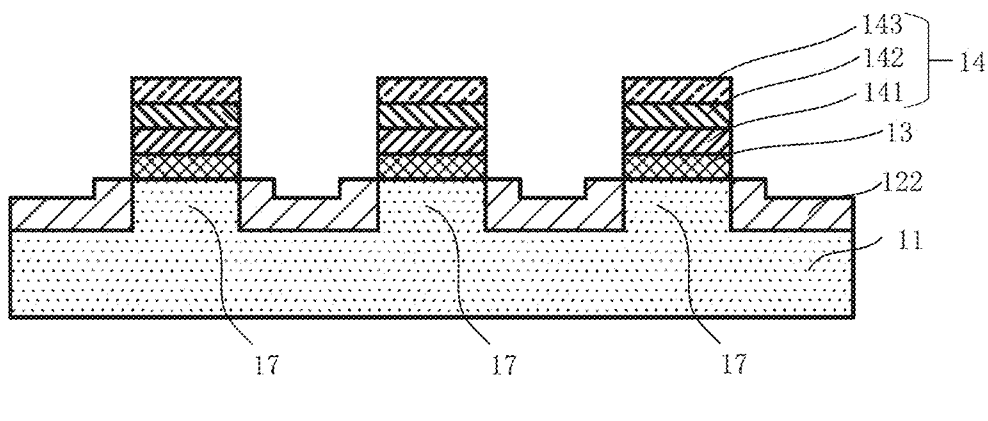
FIG. 3A is an intermediate structure diagram of a manufacturing method of a semiconductor structure according to an embodiment of the present disclosure.

FIG. 3A is an intermediate structure diagram of a manufacturing method of a semiconductor structure according to an embodiment of the present disclosure. As shown in FIG. 3A, in S3, a light-emitting structure layer 14 is provided on an upper surface of the columnar structure 17.

In some embodiments, as shown in FIG. 3A, a light-emitting structure layer 14 can include: a first semiconductor layer 141, an active layer 142 and a second semiconductor layer 143 that are stacked, and the active layer 142 is located on a side of the first semiconductor layer 141 far from the patterned substrate 11, and a conductive type of the second semiconductor layer 143 is opposite to a conductive type of the first semiconductor layer 141. It should be noted that the intermediate structure shown in FIG. 3A takes the first inhibition layer 121 not filling up the gap between the columnar structures 17 as an example.

The active layer 142 can be at least one of a single quantum well structure, a multiple quantum well (MQW) structure, a quantum line structure or a quantum dot structure. The conductivity type of this first semiconductor layer 141 is different from the conductivity type of the second semiconductor layer 143. The first semiconductor layer 141 may be a P-type semiconductor layer and the second semiconductor layer 143 may be an N-type semiconductor layer. Alternatively, the first semiconductor layer 141 may be an N-type semiconductor layer and the second semiconductor layer 143 may be a P-type semiconductor layer. The N-type semiconductor layer and the P-type semiconductor layer may include a group III nitride material. The group III nitride material may include at least one of GaN, AlGaN, InGaN or AlInGaN. The N-type doping ions in the N-type semiconductor layer can include at least one of Si ions, Ge ions, Sn ions, Se ions or Te ions. The P-type doping ions in the P-type semiconductor layer may include at least one of Mg ions, Zn ions, Ca ions, Sr ions or Ba ions.

The formation process of the first semiconductor layer 141, the active layer 142 and the second semiconductor layer 143 may include: atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or a combination thereof.

In some embodiments, as shown in FIG. 3A, before the epitaxial growth of the first semiconductor layer 141, a nucleation layer (not shown in the figures) and a buffer layer 13 are sequentially grown on the exposed surface of the columnar structure. A material of the nucleation layer can include, for example, AlN, AlGaN, etc., and a material of the buffer layer 13 can include at least one of AlN, GaN, AlGaN or AlInGaN. The formation method of the buffer layer 13 can be the same as the formation method of the first semiconductor layer 141. The nucleation layer can alleviate the lattice mismatch and thermal mismatch between the patterned substrate 11 and the subsequent semiconductor layer, and avoid the influence of impurities in the patterned substrate 11 on the growth of the subsequent semiconductor layer. The buffer layer 13 can reduce the stress caused by the lattice mismatch and thermal mismatch between the patterned substrate 11 and the subsequent semiconductor layer, and reduce the warping, to improve crystal quality.

It should be noted that, in the embodiments of the present disclosure, a certain material is represented by chemical elements, but a molar ratio of each chemical element in the material is not limited. For example, the GaN material contains Ga element and N element, but the molar proportions of Ga element and N element are not limited; the AlGaN material contains three elements, Al, Ga and N, but their molar proportions are not limited.

Figure 6:
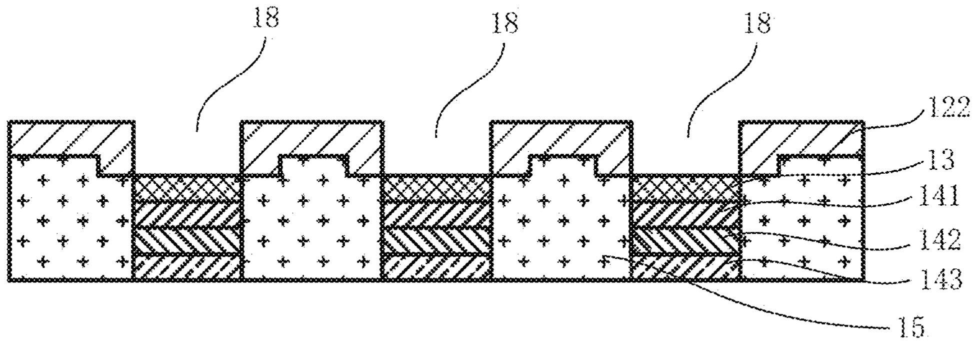
FIG. 6 is an intermediate structure diagram of a manufacturing method of a semiconductor structure according to an embodiment of the present disclosure.

FIG. 6 is an intermediate structure diagram of a manufacturing method of a semiconductor structure according to an embodiment of the present disclosure. As shown in FIG. 6, in S4, the patterned substrate 11 is removed, the positions corresponding to the columnar structures 17 after removing the patterned substrate 11 form holes 18, one of the holes 18 is located between the two adjacent second inhibition layers 122, and the holes 18 correspond to the light-emitting structure layers 14 one by one.

In some embodiments, the patterned substrate 11 can be removed by dry etching or wet etching. Using a dry etching gas or a wet etching solution with high etching selection ratio for the patterned substrate 11 can ensure that the light-emitting structure layer 14 and the second inhibition layers 122 are not damaged while the patterned substrate 11 is removed. In some examples, the patterned substrate 11 may also be removed by a peeling-off process. The present disclosure does not limit the removing process of the patterned substrate 11.

Figure 2C:
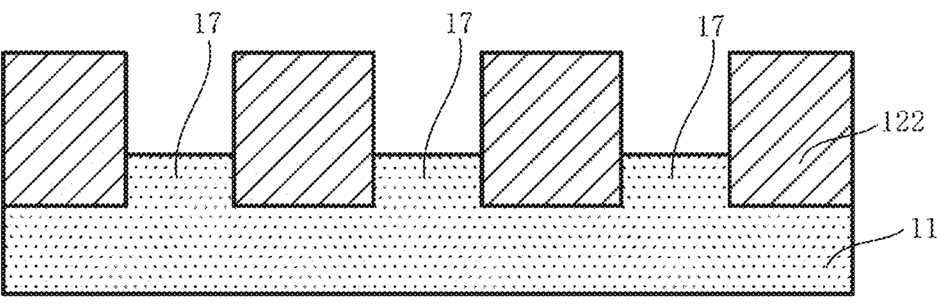
FIG. 2C is an intermediate structure diagram of a manufacturing method of a semiconductor structure according to an embodiment of the present disclosure.
Figure 3B:
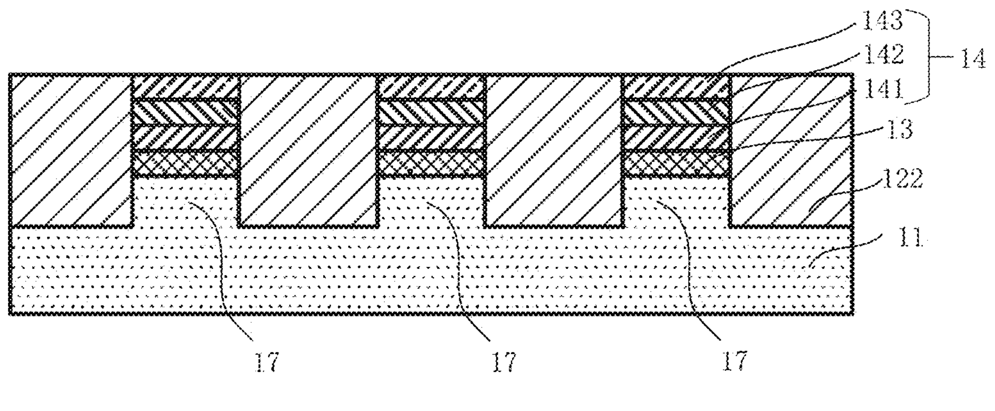
FIG. 3B is an intermediate structure diagram of a manufacturing method of a semiconductor structure according to an embodiment of the present disclosure.

In some embodiments, as shown in FIG. 2C, the first inhibition layer 121 can be removed by etching to obtain the second inhibition layer 122. The upper surface of the second inhibition layer 122 obtained by this manner is higher than the upper surface of the columnar structure 17, and the gap formed between the two adjacent second inhibition layers 122 corresponds to the columnar structure 17. Then, as shown in FIG. 3B, a light-emitting structure layer 14 can be formed on the upper surface of the columnar structure 17 in the gap between the two adjacent second inhibition layers 122. Therefore, the second inhibition layers 122 limit the growth range of the light-emitting structure layer 14, improving the quality of the light-emitting structure layer 14, and the second inhibition layers 122 can protect the light-emitting structure layer 14, for example, the second inhibition layers 122 can prevent short circuit between the light-emitting structure layers 14.

Figure 8:
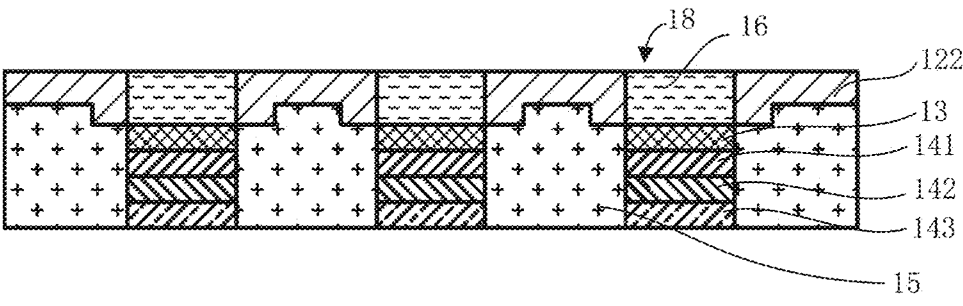
FIG. 8 is a schematic diagram of a semiconductor structure according to an embodiment of the present disclosure.

FIG. 8 is a schematic diagram of a semiconductor structure according to an embodiment of the present disclosure. As shown in FIG. 8, in some embodiments, after the patterned substrate 11 is removed in step S4, the method further includes S5. In S5, a color converting layer 16 is provided in the hole 18, the light-emitting structure layer 14 and the color converting layer 16 are stacked and arranged along the light-emitting direction, and the second inhibition layer 122 is located between two adjacent color converting layers 16.

In some embodiments, the color converting layer 16 includes a quantum dot structure. Quantum dots, also known as nanocrystals, are nanoparticles composed of II-VI or III-V elements. The particle size of quantum dots is between 1-10 nm, which has the effect of electroluminescence and photoluminescence. After being stimulated, the quantum dots can emit fluorescence. The color of the emitted light is determined by the material and size. Therefore, wavelengths of emitted lights can be different by controlling the particle sizes of quantum dots. The smaller the particle size of a quantum dot, the bluer the color of the emitted light; and the larger the particle size of a quantum dot, the redder the color of the emitted light.

In some embodiments, the light-emitting structure layer 14, for example, can emit blue light through an active layer 142 containing GaN material. Correspondingly, each color converting layer 16 can include red quantum dots, green quantum dots or blank dots. Red quantum dots will emit red fluorescence under the excitation of blue light, green quantum dots will emit green fluorescence under the excitation of blue light, and blank dots will emit blue light, thus forming three primary colors and realizing full-color LED. It should be noted that the color converting layer for the blank dot can be understood as a colorless transparent region without quantum dot material, enabling blue light to penetrate.

It should be noted that in the manufacturing method of the semiconductor structure provided by the present disclosure, the exposed columnar structure 17 in the patterned substrate 11 is used for epitaxial growth of the light-emitting structure layer 14 to form the light-emitting unit of the semiconductor structure. After the patterned substrate 11 is removed, at the regions corresponding to the columnar structures 17, the holes 18 to accommodate the color converting layers 16 are obtained, thereby reducing the steps where a hole is re-etched to contain the color converting layer in the full-color LED manufacturing process, simplifying the process flow, reducing the impact of the etching process on the semiconductor structure, and improving the luminous characteristics of the semiconductor structure.

Figure 4A:
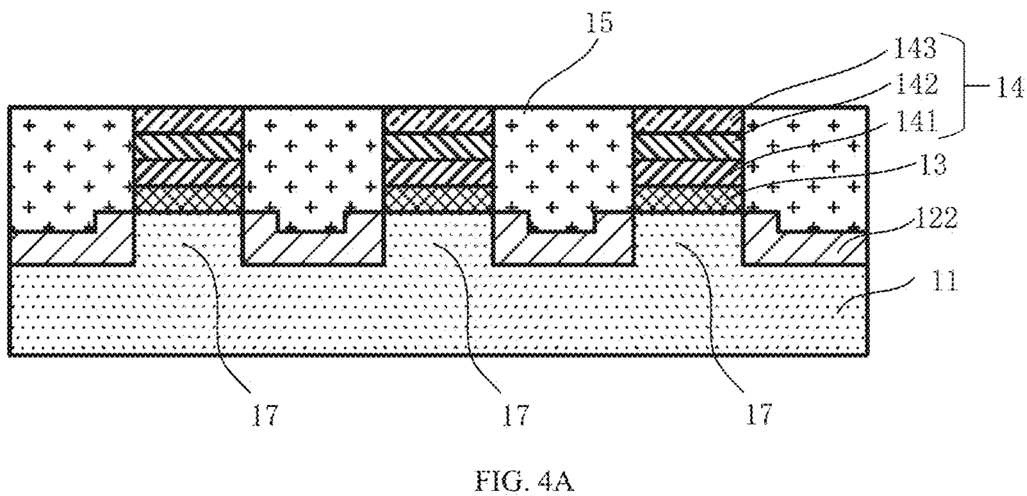
FIG. 4A is an intermediate structure diagram of a manufacturing method of a semiconductor structure according to an embodiment of the present disclosure.

In some embodiments, FIG. 4A is an intermediate structure diagram of a manufacturing method of a semiconductor structure according to an embodiment of the present disclosure. As shown in FIG. 4A, after step S3 of providing the light-emitting structure layer 14 on the upper surface of the columnar structure 17, and before step S4 of removing the patterned substrate 11, the method further includes step S31. In step S31, an insulation layer 15 is filled between the two adjacent light-emitting structure layers 14.

Figure 4B:
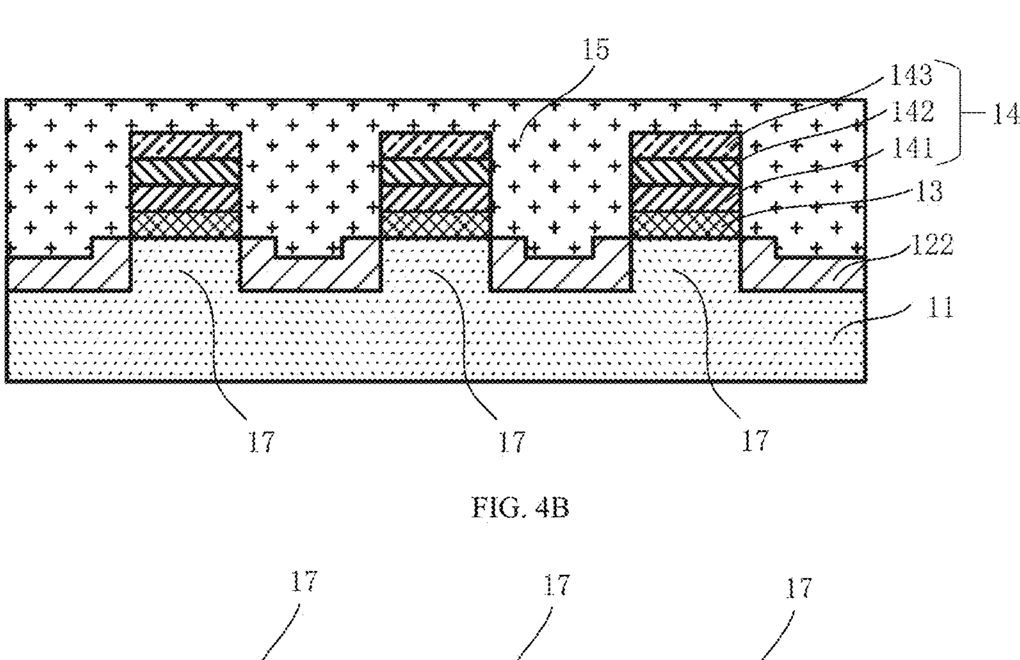
FIG. 4B is an intermediate structure diagram of a manufacturing method of a semiconductor structure according to an embodiment of the present disclosure.

Specifically, as shown in FIG. 4A, the upper surface of the insulation layer 15 can be flush with the upper surface of the light-emitting structure layer 14. In other embodiments, FIG. 4B is an intermediate structure diagram of a manufacturing method of a semiconductor structure according to an embodiment of the present disclosure. As shown in FIG. 4B, the insulation layer 15 can cover the light-emitting structure layer 14, which plays a protective role in insulating the light-emitting structure layer 14 from the external environment. In some examples, the material of the insulation layer can be non-transparent material, such as black glue and other insulating materials, so as to realize that the light-emitting structure layer 14 forms an independent light-emitting unit, and the black glue limits the light emitted only in the region where the light-emitting structure layer 14 is located. The material of the insulation layer 15 can also be transparent material, such as silicon oxide and other transparent insulating materials, to achieve transparent display effect.

In some examples, as shown in FIG. 4A, the second inhibition layer 122 does not completely fill the gap between the columnar structures 17, and at least part of the insulation layer 15 and the second inhibition layer 122 together fill up the gap between the columnar structures 17, thereby increasing the contact area between the insulation layer 15 and the second inhibition layer 122, improving the mechanical strength of the combination of the insulation layer 15 and the second inhibition layer 122, and improving the mechanical stability of the semiconductor structure.

In some embodiments, when a material of the insulation layer 15 is a transparent material, a ratio of a projected area of the second inhibition layers 122 on a plane of the patterned substrate 11 to a projected area of the light-emitting structure layers 14 on the plane of the patterned substrate 11 is greater than or equal to 1. Therefore, better transparent display effect can be achieved.

In some embodiments, after step S31 of filling the insulation layer 15 between the two adjacent light-emitting structure layers 14, the method further includes step S32: inverting on the support base 19.

Figure 5A:
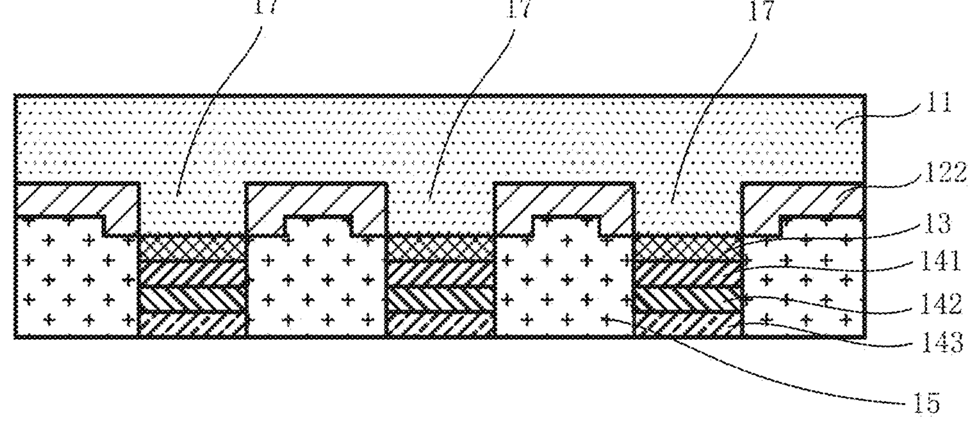
FIG. 5A is an intermediate structure diagram of a manufacturing method of a semiconductor structure according to an embodiment of the present disclosure.

FIG. 5A is an intermediate structure diagram of a manufacturing method of a semiconductor structure according to an embodiment of the present disclosure. As shown in FIG. 5A, the semiconductor structure obtained after filling the insulation layer 15 is inverted, such that a side of the semiconductor structure with the patterned substrate 11 is upward, thereby facilitating further processing for the semiconductor structure in subsequent processes. In some examples, the semiconductor structure obtained after filling the insulation layer 15 is inverted on a support base. The support base is configured to support the semiconductor structure after removing the patterned substrate 11. In some examples, the support base is a drive circuit board.

Figure 5B:
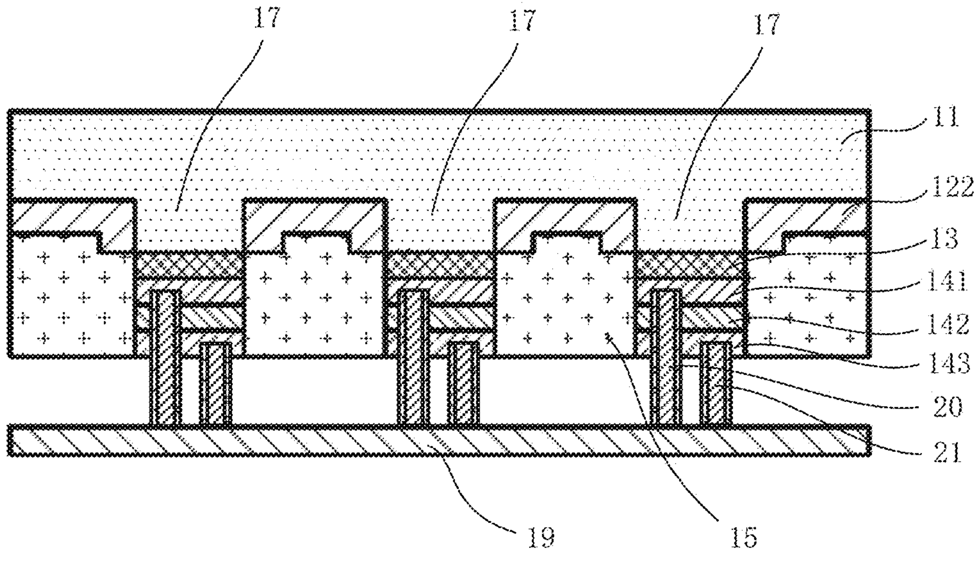
FIG. 5B is an intermediate structure diagram of a manufacturing method of a semiconductor structure according to an embodiment of the present disclosure.

In some embodiments, FIG. 5B is an intermediate structure diagram of a manufacturing method of a semiconductor structure according to an embodiment of the present disclosure. As shown in FIG. 5B, the light-emitting structure layer 14 includes a first semiconductor layer 141, an active layer 142 and a second semiconductor layer 143 that are staked. The active layer 142 is located on a side of the first semiconductor layer 141 far from the patterned substrate 11, and a conductive type of the second semiconductor layer 143 is opposite to a conductive type of the first semiconductor layer 141. After step S32 of inverting on the support base 19, the method further includes step S33: providing a first electrode 20 and a second electrode 21, where the first electrode 20 penetrates the second semiconductor layer 143 and the active layer 142, and is electrically connected to the first semiconductor layer 141; and the second electrode 21 is electrically connected to the second semiconductor layer 143.

As shown in FIG. 5B, after the semiconductor structure obtained after filling the insulation layer 15 is inverted, the semiconductor structure can be fixed on the support base 19 through the first electrode 20 and the second electrode 21, and then the subsequent processes can be carried out. In some examples, the inverted semiconductor structure is fixed on the support base 19 through the first electrode 20 and the second electrode 21, or other conductor structures (not shown). Therefore, compared with related technologies, the embodiments provided by the present disclosure optimize a process flow.

In some embodiments, the areas of the cross-sections at least two columnar structures 17 are different, and the plane of the cross-sections is parallel to the plane of the patterned substrate 11.

Figure 3C:
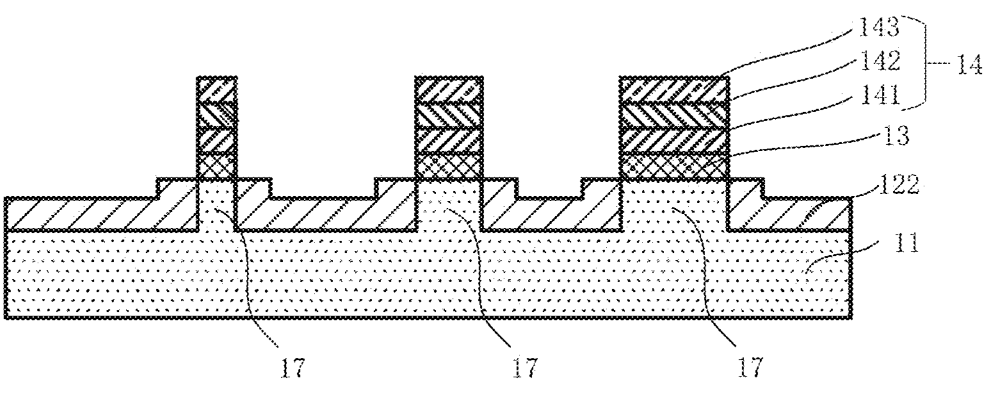
FIG. 3C is an intermediate structure diagram of a manufacturing method of a semiconductor structure according to an embodiment of the present disclosure.

FIG. 3C is an intermediate structure diagram of a manufacturing method of a semiconductor structure according to an embodiment of the present disclosure. As shown in FIG. 3C, the areas of the cross-sections of the three columnar structures 17 in FIG. 3C are different. Therefore, the areas of the cross-sections of the three light-emitting structure layers 14 epitaxial grown on the three columnar structures 17 are also different from each other. A material of the active layer 142 in the light-emitting structure layer 14 can include GaN-based material. The active layer 143 can be doped with an In element, for example, the material of the active layer 142 can include InGaN. In some examples, the active layer 143 can also be doped with an Al element, for example, the material of the active layer 142 can include AlGaN. The band gap width of InN is about 0.7 cV, which is less than the band gap width of GaN 3.4 cV. Therefore, the greater the doping amount of In, the longer the emitting-light wavelength of the light-emitting structure layer 14. The band gap width of AlN is about 6.2 eV, which is larger than the band gap width of GaN 3.4 eV. Therefore, the greater the doping amount of Al, the shorter the emitting-light wavelength of the light-emitting structure layer 14.

The areas of the cross-sections of the columnar structures 17 are different, so when the light-emitting structure layers 14 are grown on the upper surfaces of the columnar structures 17, the flow rate of the reaction gas around each columnar structure 17 is different, so the doping rates of In element, Al element and Ga element are different. The doping efficiency of In element and Al element is different, which makes the component proportions of In element and Al element in the grown active layer 142 different. Specifically, the smaller the proportion of the area of the columnar structure 17, the faster the growth rate of the basic material GaN of the active layer 14, and because the doping of In element has better selectivity, the doping rate of In element is greater than the doping rate of Ga element. Therefore, the smaller the area of the cross-section of the columnar structure 17, the higher the component content of In element in InGaN in the active layer 142. Conversely, the greater the area of the cross-section of the columnar structure 17, the less the difference between the doping rate of In element and the doping rate of Ga element, i.e., the less efficient the doping of In element and the lower the component content of In element in the grown active layer 142. In other embodiments, the base material GaN of the active layer 142 is doped with Al element. The smaller the area of the cross-section of the columnar structure 17, the faster the growth rate of the base material GaN of the light-emitting structure layer 14 on the upper surface of the columnar structure 17, while because the growth of Al element is not selective, the doping rate of Al element is less than the doping rate of Ga element. Therefore, the smaller the area of the cross-section of the columnar structure 17, the lower the Al component content in AlGaN in the active layer 142, the smaller the doping amount of Al, and the longer the emitting-light wavelength of the light-emitting structure layer 14.

In addition, the larger the area of the cross-section of the columnar structure 17, the smaller the thickness of the active layer 142. The smaller the area of the cross-section of the columnar structure 17, the greater the thickness of the grown active layer 142, and the greater the thickness of the quantum well. Because of the quantum Stark effect, the emitted light wavelength increases. It should be noted that the thickness of the light-emitting structure layer 14 with different cross-sectional area illustrated in FIG. 3C does not represent the true thickness of the light-emitting structure layer 14. As mentioned above, the thickness of the light-emitting structure layer 14 with smaller cross-sectional area is larger.

Therefore, through three columnar structures 17 with different cross-sectional areas, the active layers containing different In/Al component contents can be realized, and then three light-emitting structure layers 14 that can emit different colors of light can be realized. Therefore, a quantum dot structure can be provided on a side of each of the three light-emitting structure layers 14 in the subsequent process to achieve the effect of color enhancement. For example, the light-emitting structure layers 14 of the three active layers with different In/Al component contents respectively emit red light, green light and blue light, and then, in combination with the quantum dot structure of their respective colors, can emit red light, green light and blue light with higher saturation. Therefore, a full-color LED which can emit light with multiple colors can be realized by a single epitaxy, and the process is simple.

In some embodiments, the patterned substrate 11 includes a silicon substrate. After step S22 of removing the first inhibition layer 121 on the columnar structures 17 to obtain the second inhibition layers 122, which are located between the columnar structures 17. The method further includes step S23. In step S23, the exposed surface of the columnar structure is treated with an alkaline solution, such that the exposed surface of the columnar structure 17 is a (111) crystal surface.

Due to the anisotropy of monocrystalline silicon, the etching rate of the monocrystalline silicon in the alkaline solution varies in different crystal orientations. A KOH solution can be used to etch the monocrystalline silicon to produce an anisotropic V-shaped etch to obtain the (111) crystal surface. The (111) crystal surface of silicon is more conducive to the epitaxial growth of the light-emitting structure layer 14 (such as the light-emitting structure layer of the III-V compound material).

Figure 7:
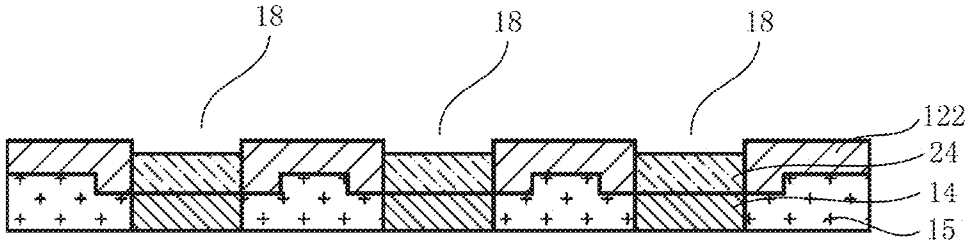
FIG. 7 is a schematic diagram of a semiconductor structure according to an embodiment of the present disclosure.

In some embodiments, as shown in FIG. 7, after removing the patterned substrate 11 and forming the hole 18 at the position corresponding to the removed columnar structure 17, the method further includes: forming a second light-emitting structure layer 24 in the hole 18.

The second light-emitting structure layer 24 can emit light in combination with the light-emitting structure layer 14. In some embodiments, the second light-emitting structure layer 24 has the same structure as the light-emitting structure layer 14, and the light emissions of the second light-emitting structure layer 24 and the light-emitting structure layer 14 can be respectively controlled, that is, the second light-emitting structure layer 24 and the light-emitting structure layer 14 can emit different colors of light respectively, and the light of different colors can be fused into white light, so as to achieve full-color display. In some embodiments, a color converting layer may further be provided on a side of the second light-emitting structure layer 24 far from the light-emitting structure layer 14.

The present disclosure further provides a semiconductor structure, as shown in FIG. 7, including: a light-emitting structure layer 14 and a hole 18 that are stacked, where the hole 18 is on a light-emitting side of the light-emitting structure layer 14; and a second inhibition layer 122 between two adjacent holes 18.

In some embodiments, the semiconductor structure further includes a color converting layer 16 in the hole 18.

In some embodiments, the semiconductor structure further includes an insulation layer 15 between two adjacent light-emitting structure layers 14.

In some embodiments, a material of the insulation layer 15 includes a transparent material, such as silicon oxide, to achieve transparent display effect. Alternatively, the material of the insulation layer 15 includes non-transparent material, such as black glue, to realize that the light-emitting structure layer 14 constitutes an independent light-emitting unit, and the black glue limits the light emitted only in a region where the light-emitting structure layer 14 is located.

In some embodiments, when the material of the insulation layer 15 is transparent material, the ratio of the projected area of the second inhibition layer 122 on the horizontal plane to the projected area of the light-emitting structure layer 14 on the horizontal plane is greater than or equal to 1, and the horizontal plane is parallel to the arrangement direction of the color converting layer 16 and the second inhibition layer 122.

In some embodiments, at least two light-emitting structure layers 14 have different cross-sectional areas. When light-emitting structure layers 14 with different cross-sectional areas are manufactured by epitaxy, according to different doping efficiency of In/Al component in the active layer, full-color LED that can emit light with multiple colors can be manufactured by one process of epitaxy, that is, at least two light-emitting structure layers 14 have different light-emitting colors.

In some embodiments, the semiconductor structure further includes a nucleation layer or a buffer layer between the color converting layer 16 and the light-emitting structure layer 14. The buffer layer can reduce the stress caused by lattice mismatch and thermal mismatch between the patterned substrate 11 and the subsequently grown semiconductor layer, thereby reducing the warpage and improving the crystal quality. The material of the nucleation layer can include AlN or AlGaN, and the material of the buffer layer can include GaN.

In some embodiments, the light-emitting structure layer 14 emits blue light. For example, the light-emitting structure layer 14 that emits blue light can be realized by controlling the content of the In component and/or Al component of the active layer in the light-emitting structure layer 14.

In some embodiments, the color converting layer 16 includes at least one of the following: yellow quantum dots, yellow phosphors, red quantum dots, red phosphors, green quantum dots or green phosphors. Compared with red light and green light, blue light LED is easier to make, and then combined with the color converting layer 16 including red quantum dots, green quantum dots and a blank region to finally realize a full-color LED that can emit red, green and blue lights. The light-emitting structure layer 14 emitting blue light combined with yellow phosphor can emit white light.

Figure 5C:
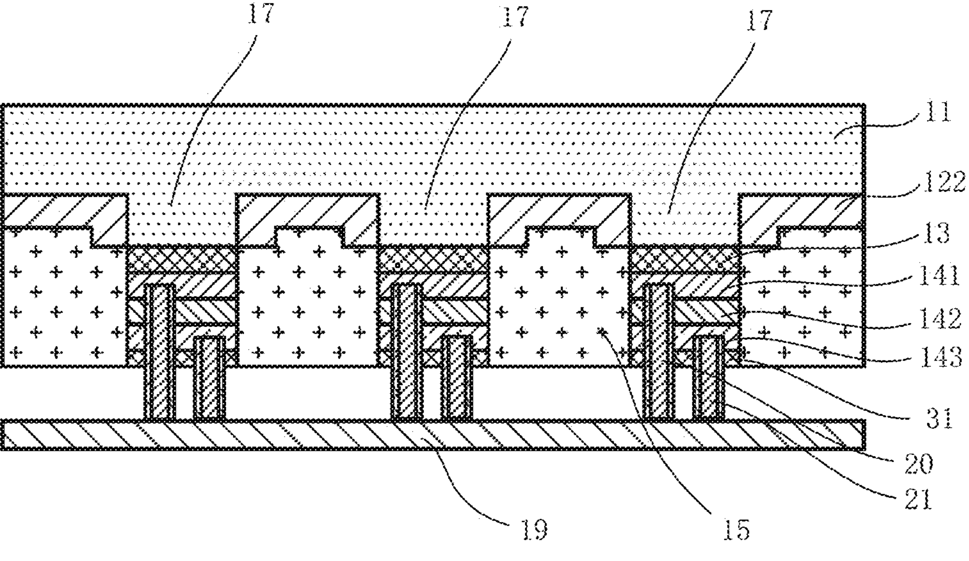
FIG. 5C is an intermediate structure diagram of a manufacturing method of a semiconductor structure according to an embodiment of the present disclosure.

In some embodiments, as shown in FIG. 5C, the semiconductor structure further includes a reflection layer 31, the reflection layer 31 is located on the side of the light-emitting structure layer 14 far from the hole 18.

The material of the reflection layer 31 may include silver, distributed Bragg reflection (DBR) or photonic crystal. The reflection layer 31 enables the light to only emit upwards.

In some embodiments, the light-emitting structure layer 14 includes: a first semiconductor layer 141, an active layer 142 and a second semiconductor layer 143 that are sequentially stacked, and the active layer 142 is located on the side of the first semiconductor layer 141 far from the substrate 11. The conductive type of the second semiconductor layer 143 is opposite to the conductive type of the first semiconductor layer 141.

In some embodiments, the light-emitting structure layer 14 further includes: a first electrode 20 and a second electrode 21, where the first electrode 20 penetrates through the second semiconductor layer 143 and the active layer 142, and is electrically connected to the first semiconductor layer 141, and the second electrode 21 is electrically connected to the second semiconductor layer 143. The first electrode 20 and the second electrode 21 respectively transmit electrical signals for the first semiconductor layer 141 and the second semiconductor layer 143.

In some embodiments, a second light-emitting structure layer 24 is provided in the hole 18. The second light-emitting structure layer 24 is located on the light-emitting side of the first light-emitting structure layer 14.

Figures 9A, 9B:
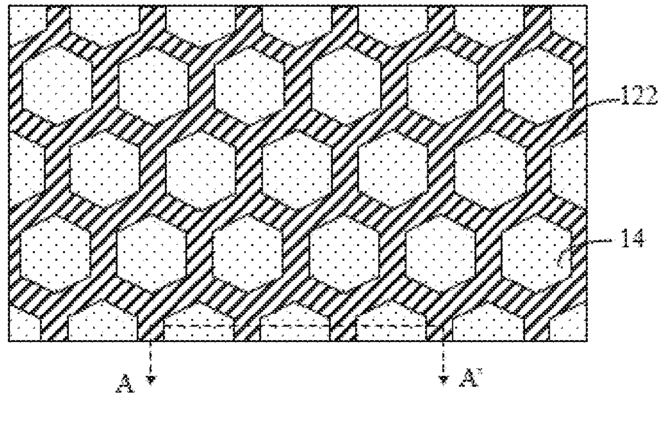
FIG. 9A is a top view of a semiconductor structure according to an embodiment of the present disclosure.
FIG. 9B is a top view of a semiconductor structure according to an embodiment of the present disclosure.

In some embodiments, as shown in FIGS. 9A and 9B, the light-emitting structure layer 14 is in unaligned rows and/or columns arrangement (as shown in FIG. 9A) or in array arrangement (as shown in FIG. 9B). It should be noted that FIGS. 7 and 8 can be sectional views along A-A in FIGS. 9A and 9B.

The embodiments and beneficial effects of the semiconductor structures are similar to those described in the manufacturing methods of semiconductor structures.

Compared with related technologies, the beneficial effects are as follows:

(1) The second inhibition layer protects the side wall of the columnar structure, defines the exposed surface of the columnar structure as the growth region, and the gap between two columnar structures as the growth inhibition region, so as to realize the selective and controllable growth of the LED structure.

(2) After removing the patterned substrate, at the regions corresponding to the columnar structures of the patterned substrate, holes to accommodate the color converting layer are obtained, which reduces the steps of re-etching to form a groove to accommodate the color converting layer in the full-color LED manufacturing process, and simplifies the process flow.

(3) The light-emitting structure layer, for example, through the active layer containing the GaN material, can emit blue light. Correspondingly, each color converting layer can include red quantum dots, green quantum dots or blank dots. Red quantum dots will emit red fluorescence under the excitation of blue light, green quantum dots will emit green fluorescence under the excitation of blue light, and blank dots will emit blue light, thus forming three primary colors and realizing full-color LED.

Therefore, specific embodiments of the present disclosure have been described. Other embodiments are within the scope of the appended claims. In some cases, the features recited in the claims can be performed in a different order and still achieve the desirable result. In addition, the order of the features depicted in the accompanying drawings is not necessary in a particular order or sequential order to achieve the desirable results. In some implementations, it may also be multitasking and parallel processing.

What is claimed is:

1. A manufacturing method of a semiconductor structure, comprising:

providing a patterned substrate, wherein the patterned substrate comprises columnar structures;

providing second inhibition layers, wherein the second inhibition layers are respectively located between two adjacent columnar structures of the columnar structures, and upper surfaces of the columnar structures are exposed;

providing a light-emitting structure layer on the upper surface of each of the columnar structures; and removing the patterned substrate, to obtain holes at regions corresponding to the columnar structures, wherein the holes are respectively located between two adjacent second inhibition layers of the second inhibition layers, and the holes correspond to the light-emitting structure layers respectively.

2. The method according to claim 1, further comprising:

providing color converting layers in the holes, wherein one of the light-emitting structure layers and one of the color converting layer corresponding to the one of the light-emitting structure layers are stacked and arranged along a light-emitting direction, and the second inhibition layers are respectively located between two adjacent color converting layers of the color converting layers.

3. The method according to claim 1, wherein after providing the light-emitting structure layers on the upper surfaces of the columnar structures and before removing the patterned substrate, the method further comprises:

filling an insulation layer between two adjacent light-emitting structure layers of the light-emitting structure layers.

4. The method according to claim 3, wherein when a material of the insulation layer is a transparent material, a ratio of a projected area of the second inhibition layers on a plane of the patterned substrate to a projected area of the light-emitting structure layers on the plane of the patterned substrate is greater than or equal to 1.

5. The method according to claim 1, wherein after providing the light-emitting structure layers on the upper surfaces of the columnar structures, the method further comprises:

inverting a structure obtained after providing the light-emitting structure layers on the upper surfaces of the columnar structures on a support base.

6. The method according to claim 1, wherein providing the second inhibition layers comprising:

providing a first inhibition layer on a side of the patterned substrate with the columnar structures; and removing the first inhibition layer above the columnar structures, to obtain the second inhibition layers, wherein the second inhibition layers are respectively located between two adjacent columnar structures of the columnar structures.

7. The method according to claim 6, wherein the patterned substrate comprises a silicon substrate; and after removing the first inhibition layer above the columnar structures, to obtain the second inhibition layers, the method further comprises:

treating the upper surfaces of the columnar structures with an alkaline solution, such that the upper surfaces of the columnar structures are (111) crystal surfaces.

8. The method according to claim 1, wherein at least two of the columnar structures have different cross-sectional areas.

9. The method according to claim 1, wherein one of the light-emitting structure layers comprises: a first semiconductor layer, an active layer and a second semiconductor layer that are stacked, and the active layer is located on a side of the first semiconductor layer far from the patterned substrate, and a conductive type of the second semiconductor layer is opposite to a conductive type of the first semiconductor layer; and after providing the light-emitting structure layers on the upper surfaces of the columnar structures, and before removing the patterned substrate, the method further comprises:

providing a first electrode and a second electrode, wherein the first electrode penetrates the second semiconductor layer and the active layer, and is electrically connected to the first semiconductor layer; and the second electrode is electrically connected to the second semiconductor layer.

10. The method according to claim 1, wherein after removing the patterned substrate to obtain the holes at regions corresponding to the columnar structures, the method further comprises:

forming a second light-emitting structure layer in each of the holes.

* * * * *